(12) United States Patent
Higashi et al.

(10) Patent No.: US 10,636,468 B2
(45) Date of Patent: Apr. 28, 2020

(54) SEMICONDUCTOR MEMORY DEVICE

(71) Applicant: TOSHIBA MEMORY CORPORATION, Minato-ku (JP)

(72) Inventors: Yusuke Higashi, Zushi (JP); Yuuichi Kamimuta, Yokkaichi (JP); Tsunehiro Ino, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/113,238

(22) Filed: Aug. 27, 2018

(65) Prior Publication Data
US 2019/0287599 A1 Sep. 19, 2019

(30) Foreign Application Priority Data
Mar. 15, 2018 (JP) ................................ 2018-048241

(51) Int. Cl.
| | |
|---|---|
| *G11C 11/22* | (2006.01) |
| *H01L 29/51* | (2006.01) |
| *H01L 27/1159* | (2017.01) |
| *H01L 29/78* | (2006.01) |
| *H01L 27/11507* | (2017.01) |
| *H01L 49/02* | (2006.01) |
| *H01L 27/11597* | (2017.01) |
| *H01L 29/06* | (2006.01) |
| *H01L 29/775* | (2006.01) |

(52) U.S. Cl.
CPC .......... *G11C 11/225* (2013.01); *G11C 11/221* (2013.01); *G11C 11/223* (2013.01); *G11C 11/2275* (2013.01); *H01L 27/1159* (2013.01); *H01L 27/11507* (2013.01); *H01L 27/11597* (2013.01); *H01L 28/40* (2013.01); *H01L 29/516* (2013.01); *H01L 29/78391* (2014.09); *H01L 29/0676* (2013.01); *H01L 29/775* (2013.01)

(58) Field of Classification Search
None
See application file for complete search history.

(56) References Cited

U.S. PATENT DOCUMENTS

| | | | |
|---|---|---|---|
| 6,266,276 | B1 | 6/2001 | Odani |
| 6,438,020 | B1 | 8/2002 | Yamada |
| 8,009,480 | B2 | 8/2011 | Abiko |

(Continued)

FOREIGN PATENT DOCUMENTS

| | | | |
|---|---|---|---|
| JP | 2000-182383 A | 6/2000 | |
| JP | 2001-76493 A | 3/2001 | |

(Continued)

*Primary Examiner* — Tan T. Nguyen
(74) *Attorney, Agent, or Firm* — Oblon, McClelland, Maier & Neustadt, L.L.P.

(57) ABSTRACT

A semiconductor memory device according to one embodiment includes: a memory cell, the memory cell including a ferroelectric film; and a control circuit controlling the memory cell. Additionally, the control circuit determining whether the number of times of executions of a write process or an erase process on the memory cell has reached a predetermined number of times; and, if the number of times of executions has reached the predetermined number of times, executing a voltage application process in which a first voltage of a first polarity and a second voltage of a second polarity opposite to the first polarity are applied to the ferroelectric film.

15 Claims, 14 Drawing Sheets

(56) References Cited

U.S. PATENT DOCUMENTS

| | | | |
|---|---|---|---|
| 8,184,484 B2 | 5/2012 | Fujiu | |
| 8,199,579 B2 * | 6/2012 | Shiino | G11C 11/5635 365/185.17 |
| 9,019,773 B2 * | 4/2015 | Park | G11C 16/3436 365/185.22 |
| 9,362,487 B2 | 6/2016 | Inumiya et al. | |
| 2007/0097749 A1 * | 5/2007 | Li | G11C 11/5628 365/185.22 |
| 2010/0054044 A1 * | 3/2010 | Seo | G11C 16/349 365/185.33 |
| 2011/0176362 A1 * | 7/2011 | Shibata | G11C 11/5635 365/185.03 |
| 2011/0205782 A1 * | 8/2011 | Costa | G11C 5/02 365/148 |
| 2013/0077408 A1 * | 3/2013 | Ueno | G11C 16/06 365/185.22 |
| 2014/0185381 A1 * | 7/2014 | Lee | G11C 11/5628 365/185.11 |
| 2014/0254274 A1 * | 9/2014 | Shuto | G11C 11/223 365/185.17 |

FOREIGN PATENT DOCUMENTS

| | | | |
|---|---|---|---|
| JP | 2008-251138 A | 10/2008 | |
| JP | 2014-53571 A | 3/2014 | |

* cited by examiner

SEMICONDUCTOR MEMORY DEVICE

CROSS-REFERENCE TO RELATED APPLICATIONS

This application is based upon and claims the benefit of Japanese Patent Application No. 2018-048241, filed on Mar. 15, 2018, the entire contents of which are incorporated herein by reference.

BACKGROUND

Field

The embodiments described below relate to semiconductor memory devices.

Description of the Related Art

A semiconductor memory device utilizing spontaneous polarization of a ferroelectric film has been drawing attention.

In this kind of semiconductor memory device, a memory cell includes a ferroelectric film, and, direction, polarizability or the like of the spontaneous polarization of the ferroelectric film is controlled by applying a voltage to the ferroelectric film, whereby data is stored.

In this kind of semiconductor memory device, a positive voltage and a negative voltage are repeatedly applied to the ferroelectric film for write/erase of data. However, as such voltages are repeatedly applied, spontaneous polarization of the ferroelectric film sometimes decreases gradually. Hereafter, such a phenomenon will be called "fatigue".

The inventions according to the embodiments below have been made in view of such points and have an object of providing a semiconductor memory device of long life that suppresses effects of "fatigue" of the ferroelectric film.

DETAILED DESCRIPTION

Figure 1:
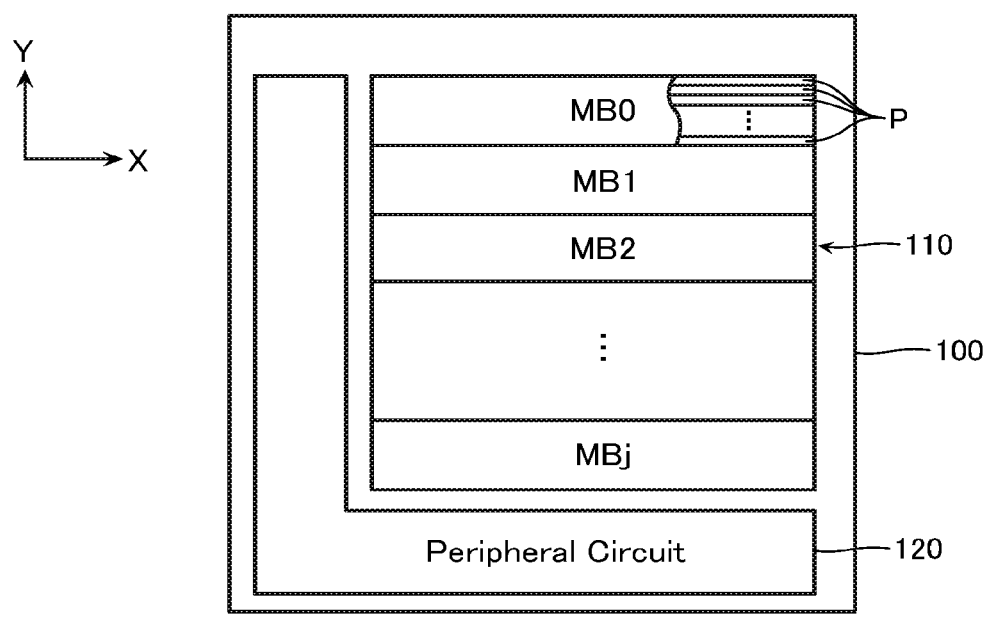
FIG. 1 is a schematic plan view showing a configuration of a memory cell array of a semiconductor memory device according to a first embodiment.

A semiconductor memory device according to one embodiment of the present invention includes: a memory cell including a ferroelectric film; and a control circuit controlling the memory cell. Additionally, the control circuit determines whether a number of times of executions of a write process or an erase process on the memory cell has reached a predetermined number of times, and, if the number of times of executions has reached the predetermined number of times, executes a voltage application process in which a first voltage of a first polarity and a second voltage of a second polarity opposite to the first polarity are applied to the ferroelectric film.

A semiconductor memory device according to another embodiment of the present invention includes: a plurality of memory cells, each of the memory cells includes a ferroelectric film; and a control circuit controlling the plurality of memory cells. Additionally, the control circuit determines whether a bit error rate of data read from the plurality of memory cells is a predetermined rate or more; and, if the bit error rate is the predetermined rate or more, executes a voltage application process in which a first voltage of a first polarity and a second voltage of a second polarity opposite to the first polarity are applied to the ferroelectric films of the plurality of memory cells.

Next, semiconductor memory devices according to embodiments will be described in detail with reference to the drawings. Note that the embodiments below are merely examples, and, are not shown with the intention of limiting the present invention.

For example, when a "memory cell" is referred to in the present specification, this is assumed to mean a storage element capable of storing 1 bit or more of data. The "memory cell" for example may include a FeFET (Ferroelectric Field Effect Transistor) including a ferroelectric film as a gate insulating film of a field effect transistor (FET, Field-Effect Transistor), may include a ferroelectric capacitor including a ferroelectric film as an insulating film between a pair of electrodes, or may include a FTJ (Ferroelectric Tunnel Junction) including a ferroelectric film as a tunnel insulating film between a pair of electrodes.

Moreover, when a "memory cell array" is referred to in the present specification, this is assumed to mean a structure including a plurality of the "memory cells", a plurality of wirings connected to these "memory cells", and so on. The "memory cell array" for example may be a FeNAND including a plurality of FeFETs connected in series, may be a FeRAM (Ferroelectric Random Access Memory) including a FeFET as a transistor in a DRAM (Dynamic Random Access Memory) or including a ferroelectric capacitor as a capacitor, or may be a memory cell array including a cross point type memory cell array structure and including a FTJ as a memory cell.

Moreover, although the present specification exemplifies methods of applying a voltage to a ferroelectric film, or the like, these methods may be appropriately changed. For example, in case that a voltage of a first polarity is applied to the ferroelectric film or the like, it is possible to apply the voltage of the first polarity to an electrode or the like corresponding to the first polarity. Additionally, it is also possible to apply a voltage of a second polarity opposite to the first polarity to an electrode or the like corresponding to the second polarity.

First Embodiment

[Memory Cell Array]

Next, a configuration of a memory cell array according to a first embodiment will be described with reference to the drawings. Note that the present embodiment describes an example where a FeFET is included as the memory cell, and, a FeNAND is included as the memory cell array.

As shown in FIG. 1, a memory chip 100 includes: a memory cell array 110; and a peripheral circuit 120 provided in a periphery of the memory cell array 110.

The memory cell array 110 includes a plurality of memory blocks MB0-MBj (where j is a natural number) arranged in a Y direction. These memory blocks MB0-MBj each include a plurality of pages P. In the present embodiment, a read process and a write process of data are executed on each of the pages P, and, an erase process of data is executed on each of the memory blocks MBi (where i is an integer between 0 and j).

The peripheral circuit 120 generates a voltage based on an instruction received from outside and applies the voltage to the memory cell array 110 to execute the likes of the read process, write process, and, erase process of data on a designated page P or memory block MBi.

Figure 2:
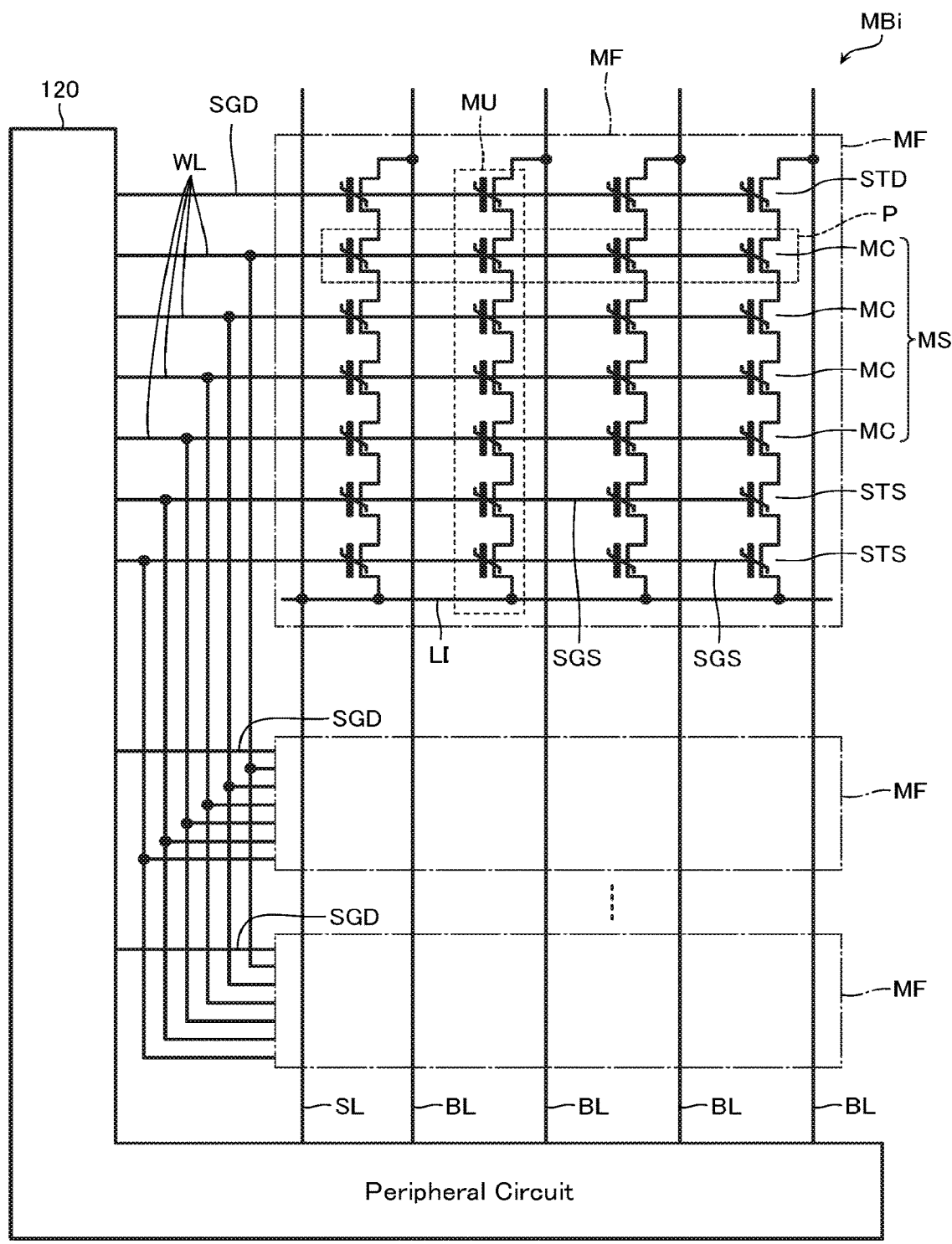
FIG. 2 is an equivalent circuit diagram showing a configuration of a memory block MBi.

FIG. 2 is an equivalent circuit diagram showing a configuration of the memory block MBi. Note that part of the configuration is omitted in FIG. 2 for convenience of explanation.

The memory block MBi is connected to the peripheral circuit 120 via bit lines BL, a source line SL, word lines WL, and, select gate lines (drain select lines SGD and source select lines SGS).

The memory block MBi includes a plurality of memory fingers MF. Each of these memory fingers MF includes a plurality of memory units MU. One ends of these plurality of memory units MU are respectively connected to the bit lines BL. Moreover, the other ends of these plurality of memory units MU are respectively connected to the source line SL via a common wiring LI.

The memory unit MU includes a drain select transistor STD, a memory string MS, and, source select transistors STS connected in series between the bit line BL and the wiring LI. Hereafter, the drain select transistor STD and the source select transistors STS will sometimes simply be called select transistors (STD, STS).

The memory string MS includes a plurality of memory cells MC connected in series. The memory cell MC according to the present embodiment is a ferroelectric transistor that includes: a semiconductor layer functioning as a channel region; a gate insulating film including a ferroelectric film; and a gate electrode, and, stores 2 bits (4 values) of data. A threshold voltage of the memory cell MC changes according to a state of spontaneous polarization of the ferroelectric film. Note that each of the plurality of memory cells MC in one memory string MS includes the gate electrode connected to each of the word lines WL. Each of these word lines WL is commonly connected to all of the memory strings MS in one memory finger MF. Moreover, the plurality of word lines connected to one memory finger MF are respectively connected to the pluralities of word lines connected to the other memory fingers MF in one memory block MBi. Note that the plurality of memory cells MC commonly connected to one word line WL in one memory finger MF configure the above-mentioned page P.

Each of the select transistors (STD, STS) is a field effect transistor that includes: a semiconductor layer functioning as a channel region; a gate insulating film; and a gate electrode. Each of the select transistors (STD, STS) includes the gate electrode connected to each of the select gate lines (SGD, SGS). Each of these select gate lines (SGD, SGS) is commonly connected to all of the select transistors (STD, STS) in one memory finger MF. Moreover, the plurality of drain select lines SGD in one memory block MBi are respectively connected to the peripheral circuit 120. On the other hand, the plurality of source select line SGS in one memory block MBi are commonly connected to each other.

Figure 3:
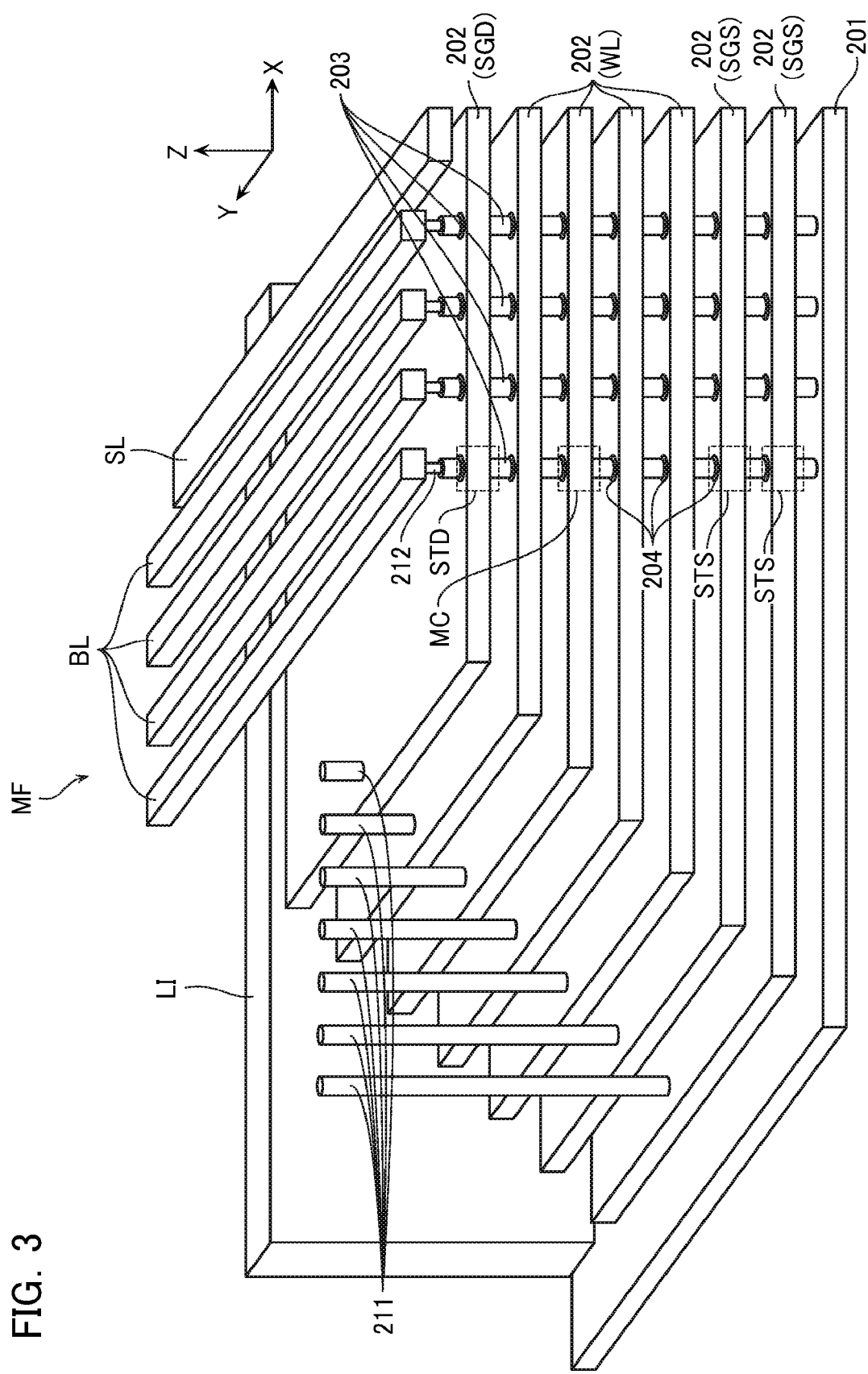
FIG. 3 is a schematic perspective view showing a configuration of a memory finger MF.
Figure 4:
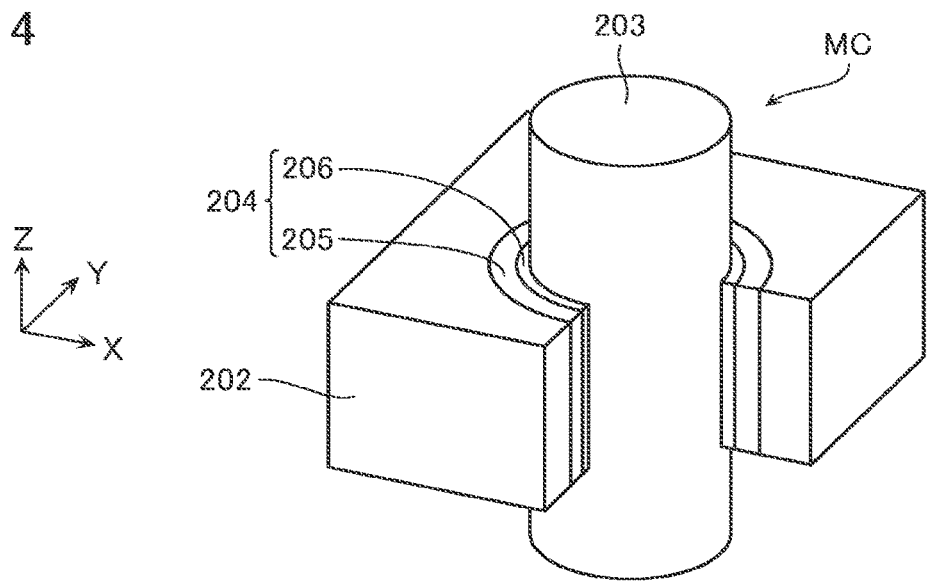
FIG. 4 is an enlarged view of part of the configuration shown in FIG. 3.

FIG. 3 is a schematic perspective view showing a configuration of the memory finger MF. FIG. 4 is an enlarged view of a part of the configuration shown in FIG. 3. Note that in FIGS. 3 and 4, part of the configuration is omitted.

As shown in FIG. 3, the memory finger MF is provided above a substrate 201. The memory finger MF includes: a plurality of conductive layers 202 arranged in a Z direction; a semiconductor layer 203 extending in the Z direction and facing the plurality of conductive layers 202; and a gate insulating film 204 provided between these conductive layers 202 and semiconductor layer 203. In this configuration, each of intersecting portions of the conductive layers 202 and the semiconductor layer 203 functions as the memory cell MC.

The substrate 201 is a semiconductor substrate configured from the likes of single crystal silicon (Si), for example. The substrate 201 has, for example, a double well structure including an n type impurity layer on an upper surface of the semiconductor substrate and further including a p type impurity layer in this n type impurity layer.

The conductive layer 202 is a plate-like conductive layer extending in an X direction, and, is including the likes of a laminated film of titanium nitride (TiN) and tungsten (W) or highly-doped polysilicon, for example. Each of the conductive layers 202 covers a side surface of the semiconductor layer 203 in the X direction and the Y direction. Each of the conductive layers 202 functions as the word line WL and the gate electrode of the memory cell MC, or, as the select gate line (SGD, SGS) and the gate electrode of the select transistor (STD, STS). Each of the conductive layers 202 includes an end section in the X direction connected to a contact 211 extending in the Z direction, and, is connected to the peripheral circuit 120 (FIG. 2) via this contact 211.

The semiconductor layer 203 is a semiconductor layer of substantially circular column shape or substantially cylindrical shape extending in the Z direction, and, includes the likes of polysilicon (p-Si), for example. The semiconductor layer 203 functions as channel regions of the memory cells MC and the select transistors (STD, STS). The semiconductor layer 203 includes an upper end connected to the bit line BL extending in the Y direction via a contact 212. The semiconductor layer 203 includes a lower end connected, via a surface of the substrate 201 and the wiring LI extending in the Z direction and the X direction, to the source line SL extending in the Y direction. Note that although the lower end of the semiconductor layer 203 is connected to the wiring LI via an upper surface of the substrate 201 in the illustrated example, the lower end of the semiconductor layer 203 may be connected to the wiring LI via another wiring, or the like.

As shown in FIG. 4, the gate insulating film 204 includes: a ferroelectric film 205 provided between the conductive layer 202 and the semiconductor layer 203; and an interface insulating film 206 provided between the ferroelectric film 205 and the semiconductor layer 203.

The ferroelectric film 205 includes, for example, hafnium (Hf) and oxygen (O) as main components. Additionally, the ferroelectric film 205 also includes at least one of silicon (Si), magnesium (Mg), aluminum (Al), barium (Ba), zirconium (Zr), gadolinium (Gd), lanthanum (La), samarium (Sm), nitrogen (N) and yttrium (Y) as additive. For example, the ferroelectric film 205 has a feature that a crystal structure of its main components is a space group Pbc $2_1$ which is a fluorite-type third orthorhombic crystal.

The interface insulating film 206 includes the likes of silicon oxide (SiOA) or Hafnium Silicate (HfSiO), for example.

As shown in FIG. 3, each of the memory cells MC arranged in the Z direction includes the gate insulating film 204. Note that, these gate insulating films 204 may be connected to each other, or, may be divided from each other.

[Memory Cell MC]

Next, characteristics of the memory cell MC will be briefly described.

Figure 5:
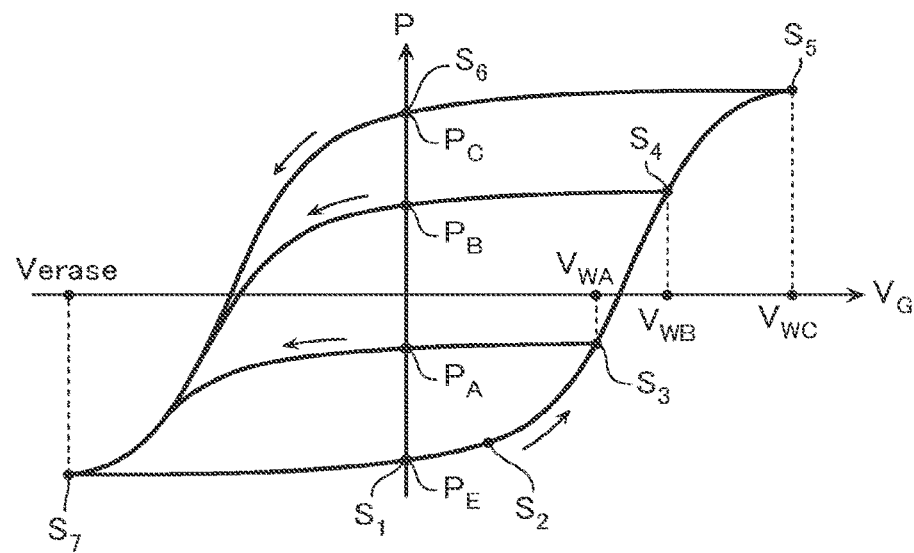
FIG. 5 is a schematic graph for explaining characteristics of a memory cell MC.

FIG. 5 is a schematic graph for explaining characteristics of the memory cell MC, with the horizontal axis showing a gate-source voltage $V_G$ of the memory cell MC, and, the vertical axis showing a polarizability P of the ferroelectric film 205. FIGS. 6-10 are schematic cross-sectional views for explaining states of the memory cell MC.

As shown in FIG. 5, when a write voltage $V_{MC}$ of positive polarity and an erase voltage $V_{erase}$ of negative polarity are alternately applied between the gate and source of the memory cell MC, a hysteresis curve indicating ferroelectricity of the ferroelectric film 205 is observed. In the drawing, states $S_1$-$S_7$ are shown on this curve.

Figure 6:
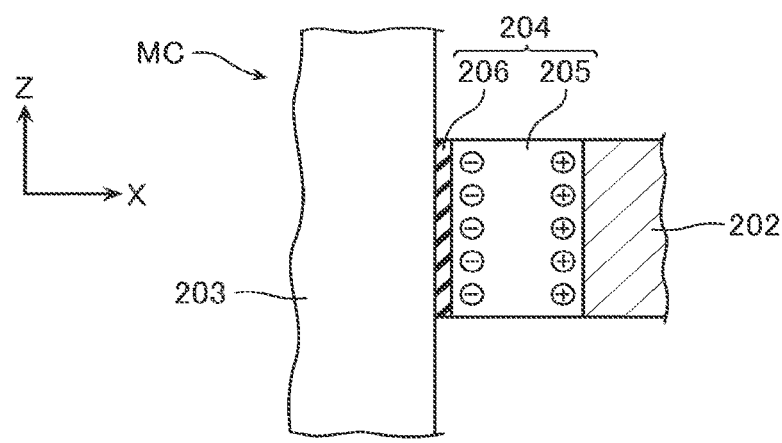
FIG. 6 is a schematic cross-sectional view for explaining a state $S_1$ of the memory cell MC.

State $S_1$ is a state where polarizability P is a negative polarizability $P_E$ and the voltage $V_G$ is zero. In this state, as shown in FIG. 6, negative charge is induced in a surface on a semiconductor layer 203 side of the ferroelectric film 205. In this state, a channel is not formed in the semiconductor layer 203, and, the memory cell MC is in an OFF state.

Figure 7:
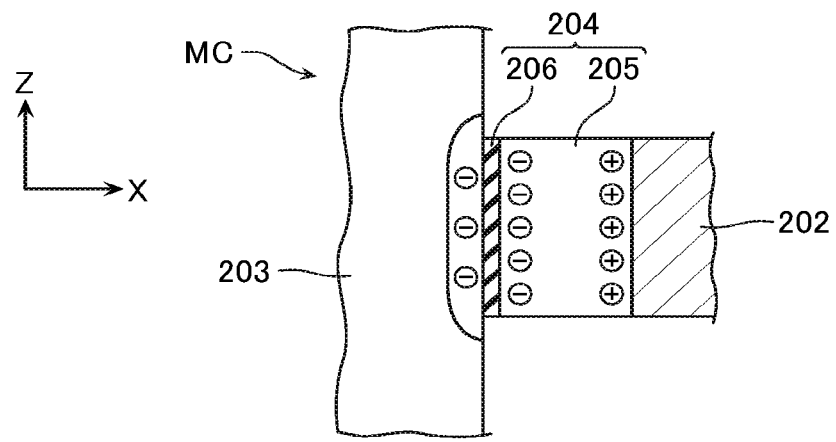
FIG. 7 is a schematic cross-sectional view for explaining a state $S_2$ of the memory cell MC.

State $S_2$ is state where the voltage $V_G$ has been increased to a predetermined voltage of positive polarity, from state $S_1$. In this state, as shown in FIG. 7, spontaneous polarization of the ferroelectric film 205 does not reverse, and, the polarizability P does not substantially change from $P_E$. However, a channel is formed in the semiconductor layer 203 due to an electric field from the conductive layer 202, and, the memory cell MC attains an ON state.

Figure 8:
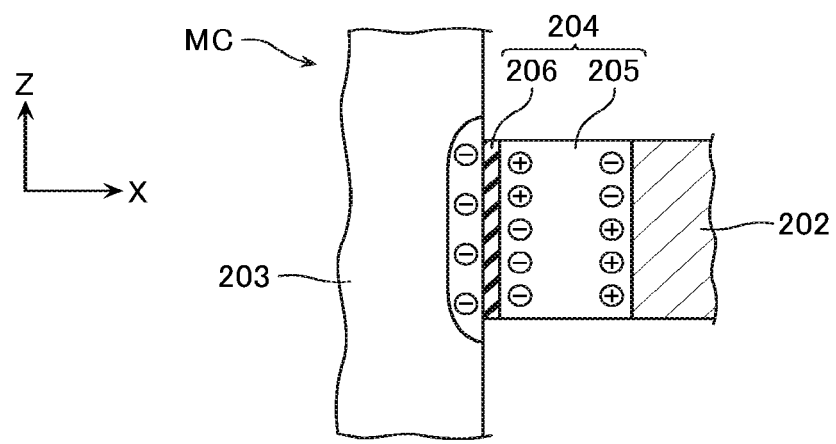
FIG. 8 is a schematic cross-sectional view for explaining a state $S_3$ of the memory cell MC.

State $S_3$ is a state where the voltage $V_G$ has been further increased to a write voltage $V_{WA}$, from state $S_2$. In this state, as shown in FIG. 8, a direction of spontaneous polarization of the ferroelectric film 205 partially reverses, and, the polarizability P increases steeply. Note that when reversal of spontaneous polarization once occurs, this state is maintained even if the voltage $V_G$ is returned to zero. For example, as shown in FIG. 5, if the voltage $V_G$ is returned to zero from state $S_3$, the polarizability P becomes a negative polarizability $P_A$ higher than $P_E$.

State $S_4$ is a state where the voltage $V_G$ has been further increased to a write voltage $V_{WB}$, from state $S_3$. In this state, reversal of spontaneous polarization of the ferroelectric film 205 further progresses, and, the polarizability P increases to a positive magnitude. If the voltage $V_G$ is returned to zero in this state, the polarizability P becomes a positive polarizability $P_R$ even higher than $P_A$.

Figure 9:
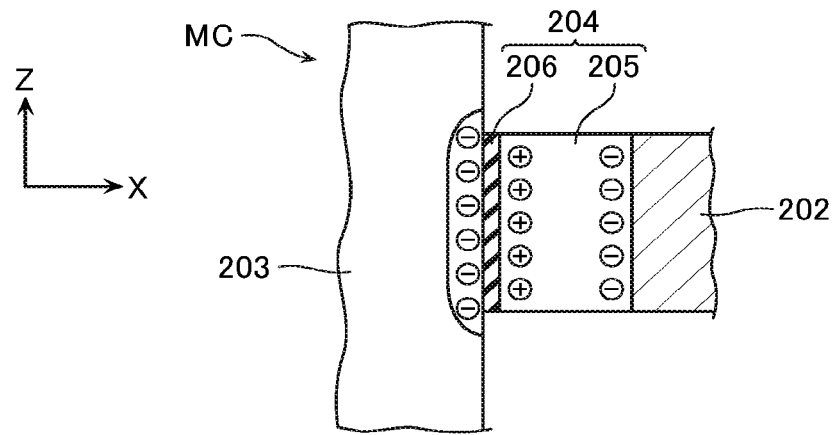
FIG. 9 is a schematic cross-sectional view for explaining a state $S_5$ of the memory cell MC.

State $S_5$ is a state where the voltage $V_G$ has been further increased to the write voltage $V_{wc}$, from state $S_4$. In this state, as shown in FIG. 9, the direction of spontaneous polarization of the ferroelectric film 205 substantially completely reverses, and, the polarizability P further increases, thereby saturating.

Figure 10:
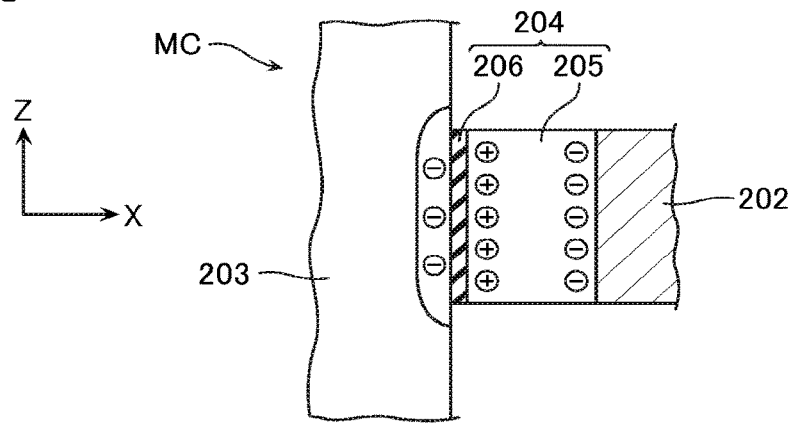
FIG. 10 is a schematic cross-sectional view for explaining a state $S_6$ of the memory cell MC.

State $S_6$ is a state where the voltage $V_G$ has been returned to zero, from state $S_5$. In this state, as shown in FIG. 10, a positive charge is induced in the surface on the semiconductor layer 203 side of the ferroelectric film 205, and, electrons inside the semiconductor layer 203 are attracted by this positive charge. In this state, a channel is formed in the semiconductor layer 203 and the memory cell MC attains the ON state, even when the voltage $V_C$ is zero.

State $S_7$ is a state where the voltage $V_G$ has been reduced to the erase voltage $V_{erase}$ of negative polarity, from state $S_6$. In this state, as shown in FIG. 6, the direction of spontaneous polarization of the ferroelectric film 205 substantially completely reverses from a positive direction to a negative direction, and, the polarizability P decreases again to a negative polarizability, thereby saturating.

Figure 11:
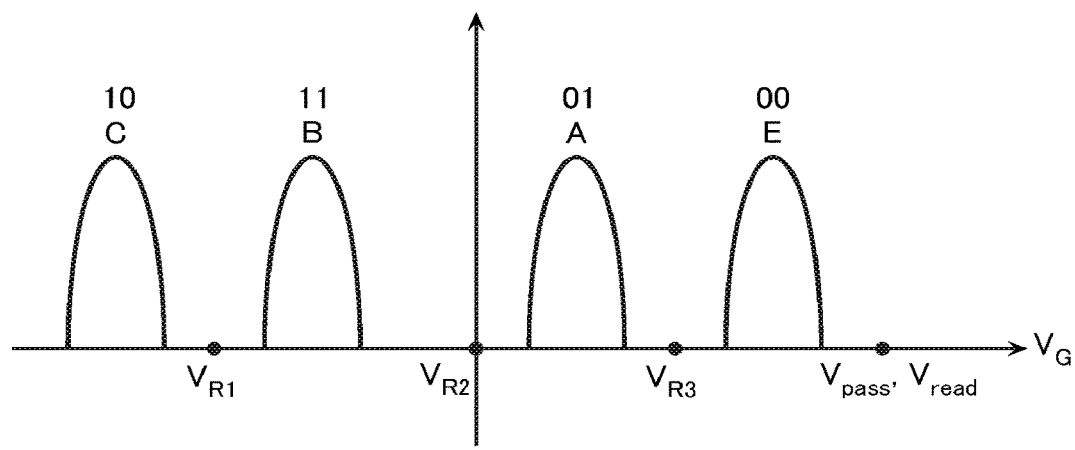
FIG. 11 is a schematic histogram for explaining about threshold distributions of the memory cell MC.

FIG. 11 is a schematic histogram for explaining about threshold distributions of the memory cells MC, with the horizontal axis showing the gate-source voltage $V_G$ of the memory cell MC, and, the vertical axis showing the number of memory cells MC.

Distribution E is a distribution of threshold voltages of the memory cells MC in which the polarizability P of the ferroelectric film 205 corresponds to $P_E$ (FIG. 5). The polarizability $P_E$ is a negative polarizability. Therefore, as explained with reference to FIG. 6, a negative charge is induced in the surface on the semiconductor layer 203 side of the ferroelectric film 205. As a result, the threshold voltages have positive magnitudes. Note that in the present embodiment, distribution E is assigned with data "00".

Distribution A is a distribution of threshold voltages of the memory cells MC in which the polarizability P of the ferroelectric film 205 corresponds to $P_A$ (FIG. 5). The polarizability $P_A$ is a negative polarizability which is higher than the polarizability $P_E$ (which has a smaller absolute value than the polarizability $P_E$), hence the threshold voltages in distribution A have positive magnitudes lower than that of the threshold voltages in the distribution E. Note that in the present embodiment, distribution A is assigned with data "01".

Distribution B is a distribution of threshold voltages of the memory cells MC in which the polarizability P of the ferroelectric film 205 corresponds to $P_D$ (FIG. 5). The polarizability $P_B$ is a positive polarizability which is higher than the polarizability $P_A$, hence the threshold voltages in distribution B have negative magnitudes lower than that of the threshold voltages in distribution A. Note that in the present embodiment, distribution B is assigned with data "11".

Distribution C is a distribution of threshold voltages of the memory cells MC in which the polarizability P of the ferroelectric film 205 corresponds to $P_C$ (FIG. 5). The polarizability $P_C$ is a positive polarizability which is higher than the polarizability $P_B$, hence the threshold voltages in distribution C have negative magnitudes which is lower than that of the threshold voltages in distribution B (which has a larger absolute value than the threshold voltages in distribution B). Note that in the present embodiment, distribution C is assigned with data "10".

Moreover, FIG. 11 shows read voltages $V_{R1}$, $V_{R2}$ and $V_{R3}$, a read pass voltage $V_{read}$, and, a write pass voltage $V_{pass}$. These voltages are set to magnitudes of a degree at which spontaneous polarization of the ferroelectric film 205 does not change.

The read voltage $V_{R1}$ is a voltage of negative polarity, and, has a magnitude between the threshold voltages of the memory cells MC belonging to distribution C and the threshold voltages of the memory cells MC belonging to distribution B.

The read voltage $V_{R2}$ is substantially zero, and, has a magnitude between the threshold voltages of the memory cells MC belonging to distribution B and the threshold voltages of the memory cells MC belonging to distribution A.

The read voltage $V_{R3}$ is a voltage of positive polarity, and, has a magnitude between the threshold voltages of the memory cells MC belonging to distribution A and the threshold voltages of the memory cells MC belonging to distribution E.

The read pass voltage $V_{read}$ and the write pass voltage $V_{pass}$ are voltages of positive polarity, and, are larger than the threshold voltages of the memory cells MC belonging to distribution E.

["Fatigue" of Ferroelectric Film 205]

Next, "fatigue" of the ferroelectric film 205 will be described. As mentioned above, in a semiconductor memory device that utilizes a ferroelectric film, a positive voltage and a negative voltage are repeatedly applied to the ferroelectric film for write/erase of data. When such voltages are repeatedly applied, sometimes "fatigue" of the ferroelectric film occurs.

Accordingly, the inventors performed two experiments in order to investigate "fatigue" of the ferroelectric film. First, as a first experiment, a predetermined positive voltage $V_1$ and a predetermined negative voltage $-V_1$ was repeatedly applied to a ferroelectric film while polarizabilities $P_F$ of the ferroelectric film was measured. Next, as a second experiment, a positive voltage $V_2$ larger than the above-described positive voltage $V_1$ and a negative voltage $-V_2$ smaller than the above-described negative voltage $-V_1$ was repeatedly applied to the ferroelectric film on which the first experiment had been performed while polarizabilities $P_F$ of the ferroelectric film was measured.

Figure 12:
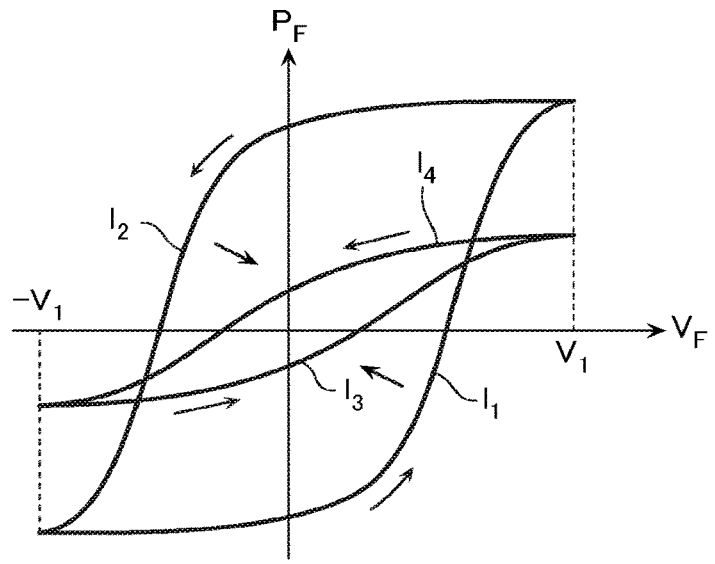
FIG. 12 is a schematic graph for explaining results of a first experiment performed by the inventors.

FIG. 12 is a schematic graph for explaining results of the first experiment.

Curves $l_1$ and $l_2$ show characteristics of the ferroelectric film immediately after the experiment was started. As illustrated, immediately after the experiment was started, a satisfactory hysteresis loop was observed. This indicates that spontaneous polarization of the ferroelectric film has been suitably controlled.

Curves $l_3$ and $l_4$ show characteristics of the ferroelectric film immediately before the experiment is ended. As illustrated, immediately before the experiment is ended, polarizability has lowered, and, a satisfactory hysteresis loop has ceased to be observed. This indicates that "fatigue" has occurred in the ferroelectric film, whereby spontaneous polarization of the ferroelectric film has become smaller.

For example, when this kind of "fatigue" occurs in the ferroelectric film 205 in the memory cell MC, sometimes it becomes difficult to write data to the memory cell MC.

Note that in the first experiment, there was a tendency for this kind of "fatigue" of the ferroelectric film to occur more prominently, the smaller the voltages $V_1$, $-V_1$ applied to the ferroelectric film were.

Figure 13:
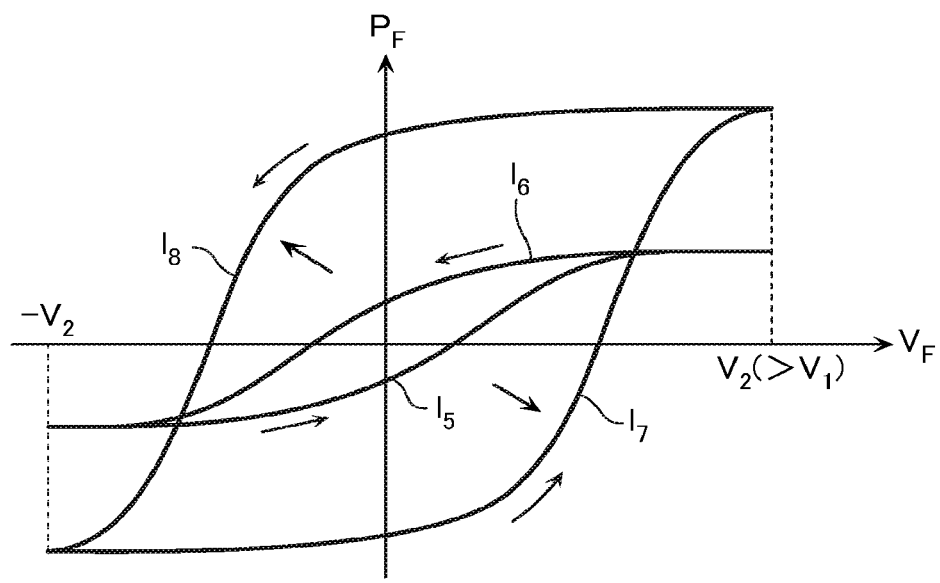
FIG. 13 is a schematic graph for explaining results of a second experiment performed by the inventors.

FIG. 13 is a schematic graph for explaining results of the second experiment.

Curves $l_5$ and $l_6$ show characteristics of the ferroelectric film immediately after the experiment was started. As illustrated, immediately after the experiment was started, the polarizability was low similarly to the characteristics shown by curves $l_3$ and $l_4$ in FIG. 12, and, a satisfactory hysteresis loop was not observed.

Curves $l_7$ and $l_8$ show characteristics of the ferroelectric film immediately before the experiment is ended. As illustrated, immediately before the experiment is ended, a satisfactory hysteresis loop has come to be observed again. This indicates that spontaneous polarization of the ferroelectric film has become suitably controllable again.

[Re-Wake-Up Process (Voltage Application Process)]

Due to the experiments of the inventors, it was understood that even if "fatigue" of a ferroelectric film has occurred, it is possible to make spontaneous polarization of the ferroelectric film to be suitably controlled again, by applying a first voltage of positive polarity and a second voltage of negative polarity to the ferroelectric film. Accordingly, in the semiconductor memory device according to the present embodiment, the first voltage and the second voltage are applied to the ferroelectric film for which occurrence of "fatigue" is a concern, effects of "fatigue" are suppressed, thereby achieving extension of life of the semiconductor memory device. Hereafter, a process in which the first voltage and the second voltage are applied to a ferroelectric film will be called a "re-wake-up process" or "voltage application process".

Note that magnitudes of the first voltage and the second voltage may be appropriately adjusted according to a material, a crystal structure or a film thickness of the ferroelectric film 205, or, a mode of "fatigue", and so on. For example, the first voltage may be the same voltage as a maximum voltage applied in the write process, like the write voltage $V_{WC}$ described with reference to FIG. 5, may be a voltage at which polarizability of the ferroelectric film 205 saturates, or, may be a voltage larger than these. Moreover, a magnitude (absolute value) of the second voltage may be the same voltage as a maximum voltage applied in the erase process, like the erase voltage $V_{erase}$, may be a voltage at which polarizability of the ferroelectric film 205 saturates, or, may be a voltage larger than these. Note that although three kinds of write voltages $V_{WA}$, $V_{WB}$, $V_{WC}$ are employed in the write process in the present embodiment, it is possible to employ one kind of write voltage in the write process. In this case, the first voltage may be larger than the write voltage.

In addition, the number of times that the first voltage and the second voltage are applied may also be appropriately adjusted. For example, they may be applied one time each, may be applied a plurality of times each, or may be appropriately applied while monitoring change in characteristics of the ferroelectric film 205. In case that each of the first voltage and the second voltage are applied a plurality of times, the first voltage and the second voltage may be applied alternately, or, may be applied in a specific pattern. Moreover, a cycle of application of the voltages, a pulse width, a waveform, and so on may also be appropriately adjusted.

Moreover, a range in the memory cell array 110 on which the re-wake-up process is collectively executed may also be appropriately adjusted. For example, such a range may be the memory cell MC, may be the page P, or may be an erase unit block on which the erase process of data is collectively executed. Note that although the present embodiment describes an example where the erase unit block is the memory block MBi, the erase unit block may be, for example, the above-mentioned memory finger MF (FIGS. 2 and 3), or may be another range.

In addition, a timing at which the re-wake-up process is executed may also be appropriately adjusted. For example, it may be executed in an erase sequence in which data is erased from the memory cells MC, may be executed in a write sequence in which data is written to the memory cells MC, or may be executed after the erase sequence has been executed and before the write sequence is executed. In case that it is executed in the erase sequence, it may be executed before or after the erase process, or, may be executed instead of the erase process. In case that it is executed in the write sequence, it may be executed before the write process.

Moreover, a condition under which the re-wake-up process is executed at the above-described timings may also be appropriately adjusted. For example, such a condition may be determined according to a number of times of executions of the write process or the erase process, may be determined according to change in characteristics of the memory cell MC, and so on, or may be determined based on other information. In case that it is determined according to the number of times of executions of the write process or the erase process, for example, it may be determined whether this number of times has reached a predetermined number of times, or not, and, the re-wake-up process may be executed every predetermined number of times. In case that it is determined according to change in characteristics of the memory cell MC and so on, for example, a bit error rate may be detected in a read sequence in which data is read from the memory cells MC, and, the re-wake-up process may be executed if a predetermined rate or more has been attained. In case that verify is performed in the write process or the erase process, the re-wake-up process may be executed if errors occur a predetermined number of times or more. Moreover, for example, it may be determined whether valid data is stored in the memory cell MC, and so on, or not. Note that these determination methods may be used independently, or, may be used combined.

[Control Circuit]

Next, an example of configuration of a control circuit for achieving the above-described re-wake-up process will be described. Note that the description below describes an example where the number of times of execution of the erase process is monitored for every memory block MBi, and, the re-wake-up process is executed every predetermined number of times. Moreover, the control circuit according to the present embodiment includes a number-of-times-of-erases holding section 303 (memory) employed in wear leveling process, and, this number-of-times-of-erases holding section 303 is utilized as a "number-of-times-of-executions holding section" for monitoring.

Figure 14:
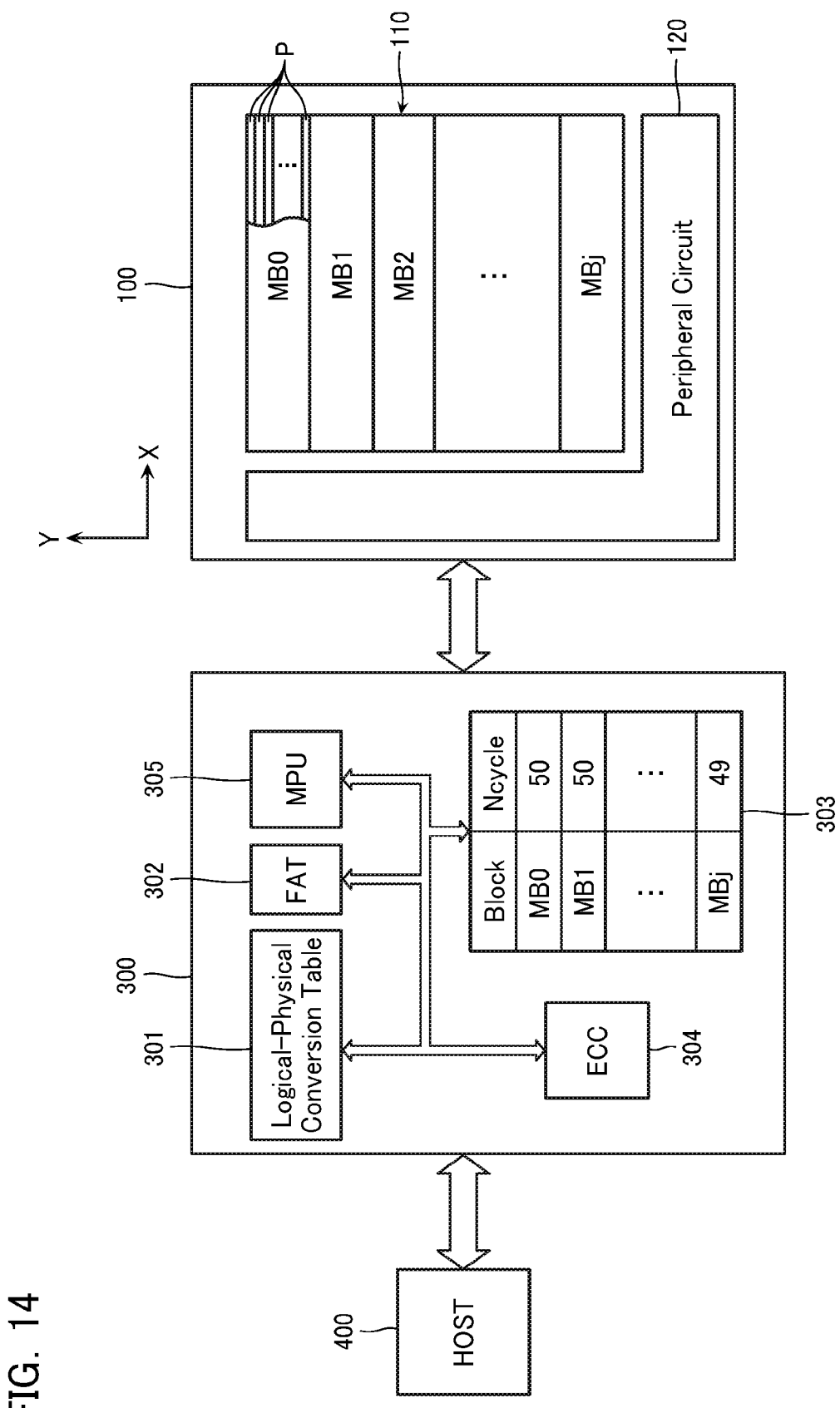
FIG. 14 is a functional block diagram showing a configuration of the semiconductor memory device according to the first embodiment.

As shown in FIG. 14, the control circuit according to the present embodiment includes: the peripheral circuit 120 provided on the memory chip 100; and a controller chip 300. The controller chip 300 includes a logical-physical conversion table 301, a FAT (File Allocation Table) 302, the number-of-times-of-erases holding section 303, an ECC circuit 304, and, an MPU (Micro Processor Unit) 305.

The logical-physical conversion table 301 holds a logical address received from a host 400 and a physical address allocated to each page P of the memory cell array 110 in an associated manner.

The FAT 302 holds FAT information indicating a state of each page P. As such FAT information, there is information that indicates, for example, being "valid", "invalid", and, "erase-completed". For example, a page P which is "valid" stores valid data which is read according to an instruction from the host 400. Additionally, a page P which is "invalid" stores invalid data which is not read according to an instruction from the host 400. Moreover, a page P which is "erase-completed" is a page to which data is not written after the erase process is executed.

The number-of-times-of-erases holding section 303 holds a physical address corresponding to the memory blocks MB0-MBj and the number of times of erase operations that have been executed on the memory blocks MB0-MBj in an associated manner.

The ECC circuit 304 detects an error of data read from the memory chip 100 and, performs correction of the data if it is possible.

The MPU 305 performs control of the memory chip 100 with reference to the logical-physical conversion table 301, the FAT 302, the number-of-times-of-erases holding section 303, and, the ECC circuit 304.

[Operation]

Next, operation of the semiconductor memory device including the memory chip 100 and controller chip 300 described above will be described. The semiconductor memory device according to the present embodiment executes a read sequence, the write sequence, and, the erase sequence in response to instructions from the host 400. Note that the above-mentioned re-wake-up process is executed in the erase sequence.

[Read Sequence]

The MPU 305 of the controller chip 300 (FIG. 14) executes the read sequence in response to a read instruction from the host 400, for example. For example, first, a physical address corresponding to a logical address received from the host 400 is acquired, by referring to the logical-physical conversion table 301. Next, the acquired physical address and the read instruction are transmitted to the memory chip 100, whereby the read process is executed. Next, data is received from the memory chip 100, transmitted to the ECC circuit 304 to perform detection of error and correction of data, and, transmitted to the host 400.

Figure 15:
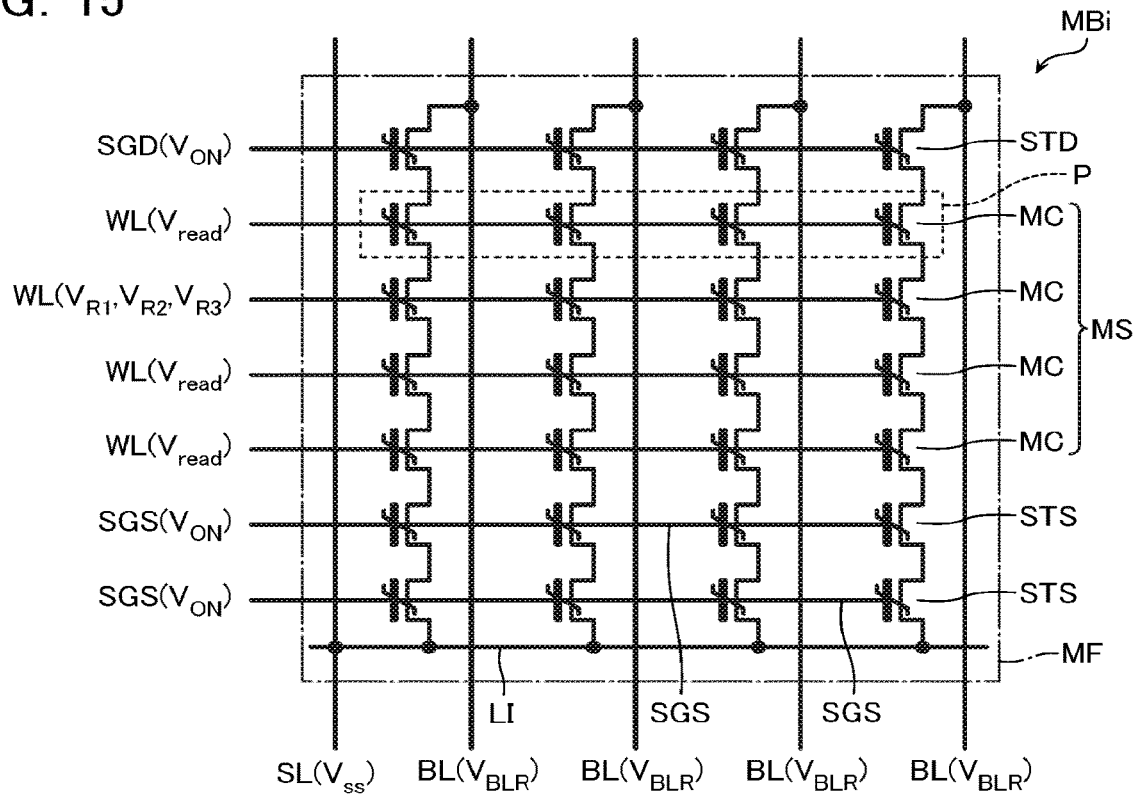
FIG. 15 is an equivalent circuit diagram for explaining about a read process.

In the read process, as shown in FIG. 15, the page P corresponding to the physical address received from the controller chip 300 is selected, and, the memory cells MC in this page P are connected to the bit lines BL. For example, the memory block MBi is selected by an unillustrated block decoder, the memory finger MF is selected by applying an ON voltage $V_{ON}$ or an OFF voltage $V_{OFF}$ to the drain select line SGD, and, the read pass voltage $V_{read}$ is applied to unselected word lines WL. In addition, the memory cells MC in the page P are connected to the source line SL by applying the ON voltage $V_{ON}$ to the source select line SGS. Next, for example, a predetermined bit line voltage $V_{BLR}$ is applied to the bit lines BL, and, a ground voltage $V_{SS}$ is applied to the source line SL. Next, the read voltages VR1, VR2, and, VR3 are sequentially applied to a selected word line WL, whereby a timing at which the memory cell MC has attained the ON state, for example, a timing at which a voltage or current of the bit line BL has changed, is detected. Thereby data stored by the memory cell MC is distinguished. Next, data of the page P that has been distinguished in this way is transmitted to the controller chip 300.

[Write Sequence]

The MPU 305 of the controller chip 300 (FIG. 14) executes the write sequence in response to a write instruction from the host 400, for example. For example, first, allocation process is executed by allocating a physical address to a received logical address, and, the physical address is acquired. Note that in the allocation process, wear leveling process is executed as required. Next, the acquired physical address, the write instruction and data received from the host 400 are transmitted to the memory chip 100, whereby the write process is executed.

In the allocation process, for example, first, reference is made to the logical-physical conversion table 301, and, it is determined whether the received logical address is being held, or not. If it is held, this logical address and its corresponding physical address are erased from the logical-physical conversion table 301. In addition, the FAT information corresponding to the erased physical address is set to "invalid" referring to the FAT 302. Next, the physical address of the page P which is "erase-completed" is acquired from the FAT 302, and, the physical address is written to the logical-physical conversion table 301 along with the received logical address.

The wear leveling process is a process for suppressing intensive write process and erase process on some of the memory blocks MBi. In the wear leveling process, for example, an average value of the number of times of erases of the memory blocks MB0-MBj in the memory cell array 110 is acquired referring to the number-of-times-of-erases holding section 303, a memory block MBi of which the number of times of erases is less than this average value is detected, and, the physical address corresponding to the page P in the detected memory block MBi is acquired.

Figure 16:
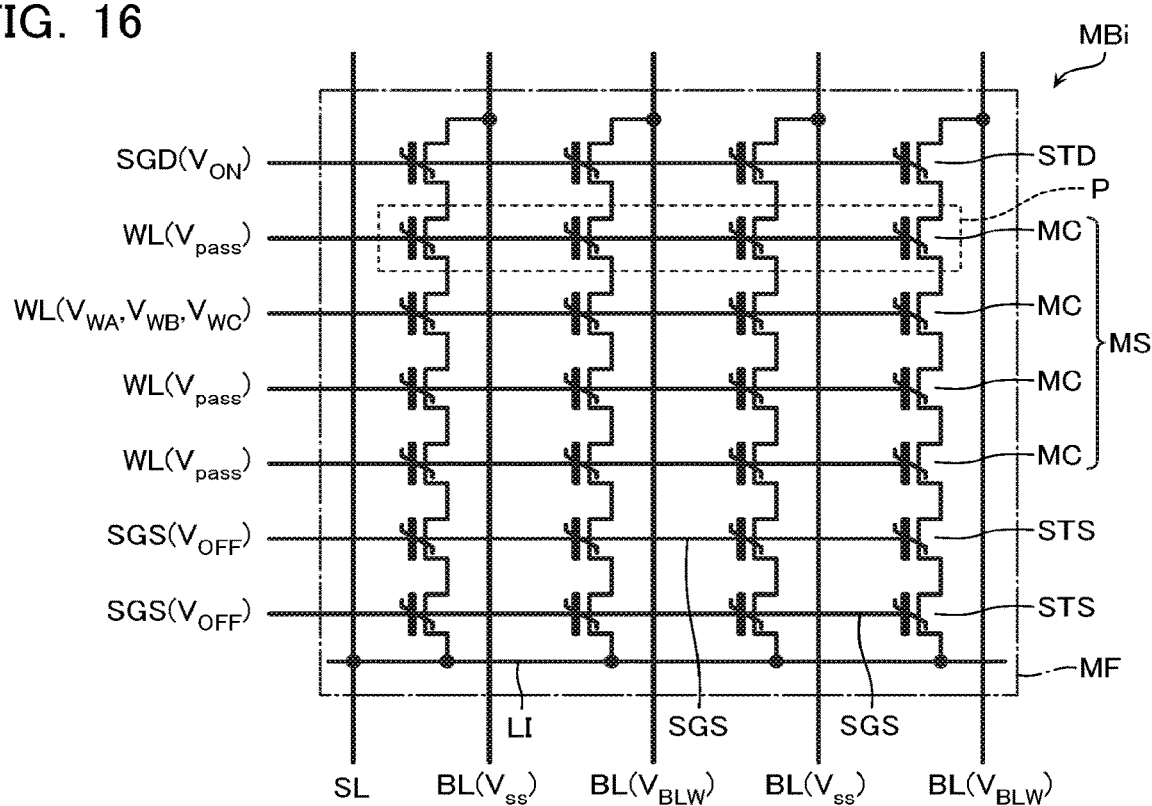
FIG. 16 is an equivalent circuit diagram for explaining about a write process.

In the write process, as shown in FIG. 16, the page P corresponding to the physical address received from the controller chip 300 is selected, and, the memory cells MC in this page P are connected to the bit lines BL, similarly to in the above-described read process. However, in the write process, the unselected word lines WL are applied with the write pass voltage $V_{pass}$. Next, for example, the bit lines BL connected to the memory cells MC corresponding to data "00" are applied with a predetermined bit line voltage $V_{BLW}$, and, the bit lines BL connected to the memory cells MC corresponding to data "01", "11", or "10" are applied with the ground voltage $V_{SS}$. Next, the selected word line WL is applied with the write voltage $V_{WA}$, $V_{WB}$, or $V_{WC}$ (refer to FIG. 5), whereby controlling states of the memory cells MC from "00" to "01", "11", or "10".

Note that in the write process, application of the write voltage $V_{WA}$, $V_{WD}$, or $V_{WC}$ and write verify may be performed alternately. In the write verify, for example, a similar process to the above-mentioned read process is executed, and, it is confirmed whether threshold voltages of designated memory cells MC are changed to values in a range of distribution A, B, or C (FIG. 11), or not. If the threshold voltages are not changed, the write voltage $V_{WA}$, $V_{WB}$, or $V_{WC}$ is applied again. If the threshold voltages are changed, the write process is ended. Note that a voltage applied to the selected word line WL in the write verify may be the same as the read voltages $V_{R1}$, $V_{R2}$, and, $V_{R3}$, or may be larger than the read voltages $V_{R1}$, $V_{R2}$, and, $V_{R3}$. Moreover, the write voltages $V_{WA}$, $V_{WB}$, and, $V_{WC}$ may be increased according to the number of times of write verifies.

[Erase Sequence]

The MPU 305 of the controller chip 300 (FIG. 14) executes the erase sequence in case that the number of memory blocks MBi is a predetermined number or less, in case that an erase instruction has been received from the host 400, or the like.

Figure 17:
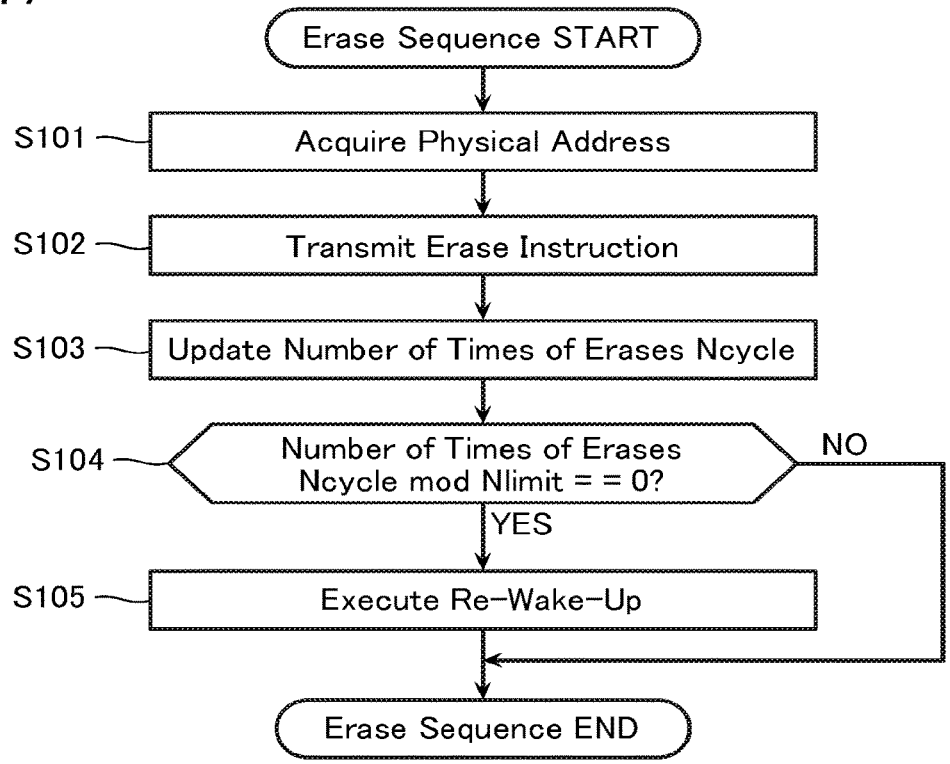
FIG. 17 is a flowchart for explaining about an erase sequence.

FIG. 17 is a flowchart for explaining about the erase sequence according to the present embodiment. In the erase sequence, for example, referring to the FAT 302, a memory block MBi of which states of all of the pages P are "invalid" is detected, whereby the physical address corresponding to this memory block MBi is acquired (step S101). Next, the acquired physical address and an erase instruction are transmitted to the memory chip 100, whereby the erase process is executed (step S102). Next, referring to the number-of-times-of-erases holding section 303, the number of times of erases $N_{cycle}$ of the memory block MBi corresponding to the above-described physical address is increased by 1 (step S103). Next, it is determined whether the number of times of erases $N_{cycle}$ of this memory block MBi has reached a predetermined number of times, or not (step S104). For example, it is determined whether the number of times of erases $N_{cycle}$ is a multiple of a predetermined integer $N_{limit}$, or not. If the number reached the predetermined number of times, for example, if the number is a multiple of the predetermined integer $N_{limit}$, said physical address and a predetermined instruction are transmitted to the memory chip 100, whereby the above-mentioned re-wake-up process is executed (step S105).

Figure 18:
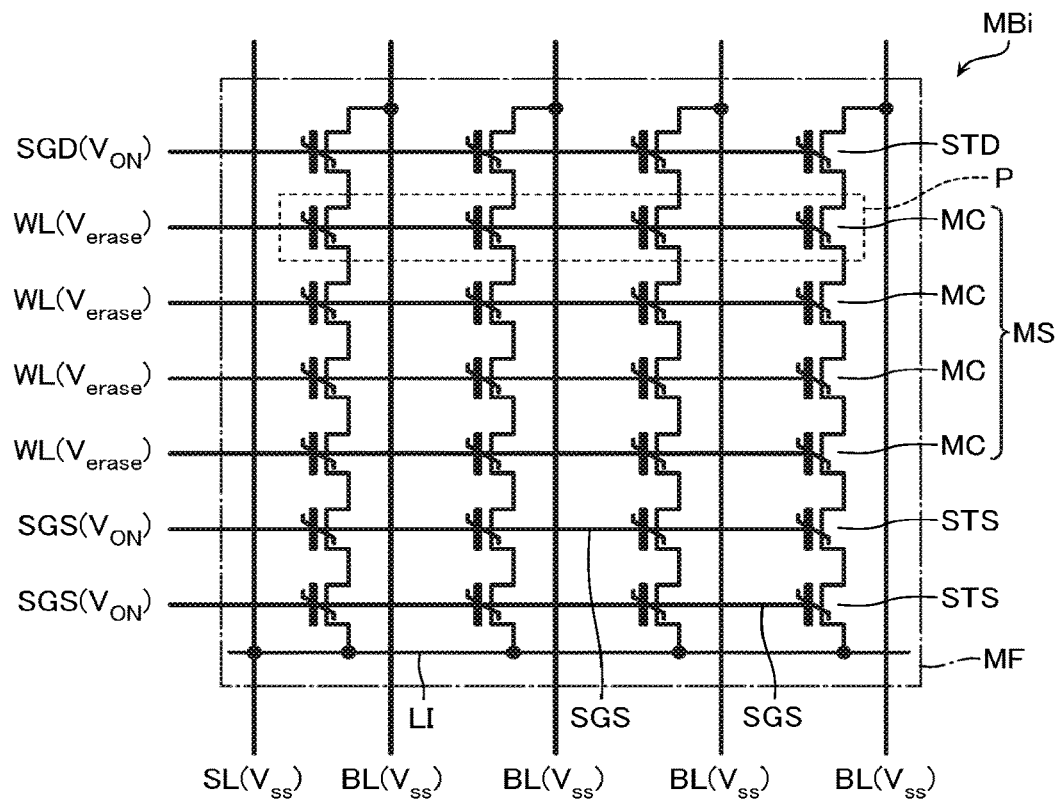
FIG. 18 is an equivalent circuit diagram for explaining about an erase process.

In the erase process (step S102), as shown in FIG. 18, the memory block MBi corresponding to the physical address received from the controller chip 300 is selected, and, the memory strings MS in this memory block MBi are connected to the source line SL and the bit lines BL. For example, the memory block MBi is selected by the unillustrated block decoder, and, the ON voltage $V_{ON}$ is applied to the select gate lines (SGD, SGS). Next, the erase voltage $V_{erase}$ (refer to FIG. 5) is applied to all of the word lines WL in the memory block MBi, and, the ground voltage $V_{SS}$ is applied to the bit lines BL and source line SL, whereby states of all of the memory cells MC in the memory block MBi are controlled to "00". Note that at a time of the erase process, holes representing carriers may be generated by a method such as GIDL (Gate Induced Drain Leakage), or, may be supplied from the source line SL, and so on.

Note that in the erase process, application of the erase voltage $V_{erase}$ and erase verify may be performed alternately. In the erase verify, for example, a similar process to the above-mentioned read process is executed, and, it is confirmed whether thresholds of all of the memory cells MC in the memory block MBi are changed to values in a range of distribution E, or not. If the thresholds are not changed, the erase voltage $V_{erase}$ is applied again. If the thresholds are changed, the erase process is ended. Note that a voltage applied to the word lines WL in the erase verify may be the same as the read voltage $V_{R3}$, or, may be smaller than the read voltage $V_{R3}$. Moreover, the erase voltage $V_{erase}$ may be decreased according to the number of times of erase verifies.

Figure 19:
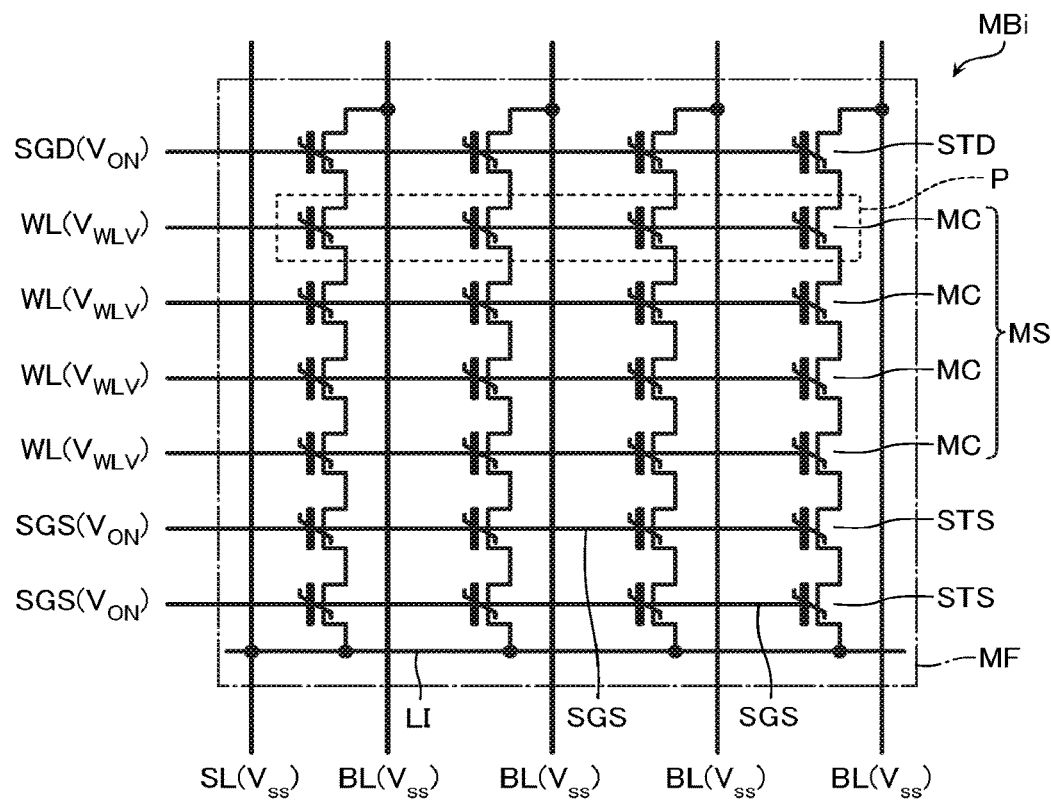
FIG. 19 is an equivalent circuit diagram for explaining about a re-wake-up process (voltage application process).
Figure 20:
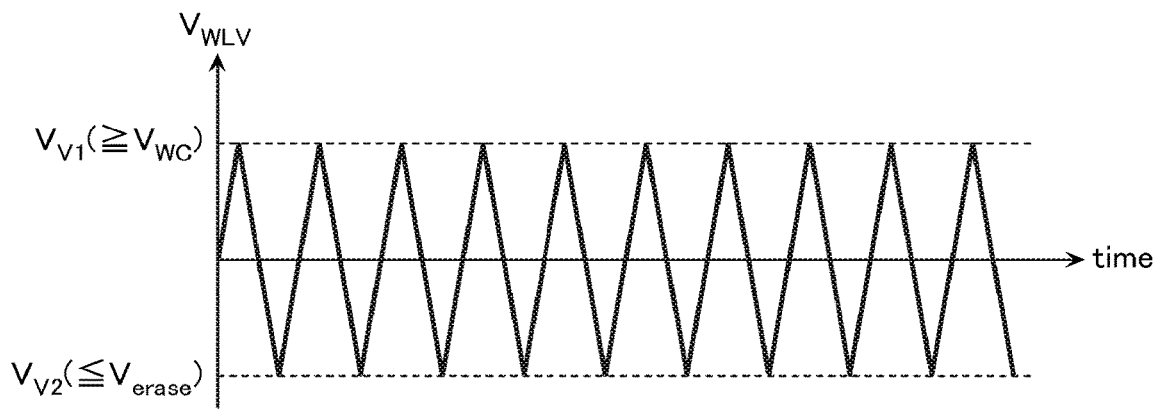
FIG. 20 is a waveform chart for explaining about the re-wake-up process (voltage application process).

In the re-wake-up process (step S105), as shown in FIG. 19, the memory block MBi corresponding to the physical address received from the controller chip 300 is selected, and, the memory strings MS in this memory block MBi are connected to the source line SL and the bit lines BL, similarly to in the above-described erase process. Next, the ground voltage $V_{SS}$ is applied to the bit lines BL and the source line SL, and, as shown in FIG. 20, a first voltage $V_{V1}$ of positive polarity and a second voltage $V_{V2}$ of negative polarity are alternately applied to all of the word lines WL in the memory block MBi a plurality of times. Note that the first voltage $V_{V1}$ is a voltage of the above-described write voltage $V_{WC}$ (refer to FIG. 5) or more, and, the second voltage $V_{V2}$ is a voltage of the above-described erase voltage $V_{erase}$ (refer to FIG. 5) or less. Note that at a time of application of the second voltage $V_{V2}$, holes may be generated by GIDL, or holes may be supplied from the source line SL, and so on.

Second Embodiment

Next, a semiconductor memory device according to a second embodiment will be described with reference to FIGS. 21 and 22. The semiconductor memory device according to the second embodiment is basically configured similarly to the semiconductor memory device according to the first embodiment. However, the condition under which the re-wake-up process is executed differs from that in the first embodiment. That is, in the second embodiment, a bit error rate is detected in the read sequence, and, the re-wake-up process is executed if the bit error rate has become a predetermined rate or more. Note that in the explanation below, descriptions of portions similar to portions in the first embodiment will be omitted.

Figure 21:
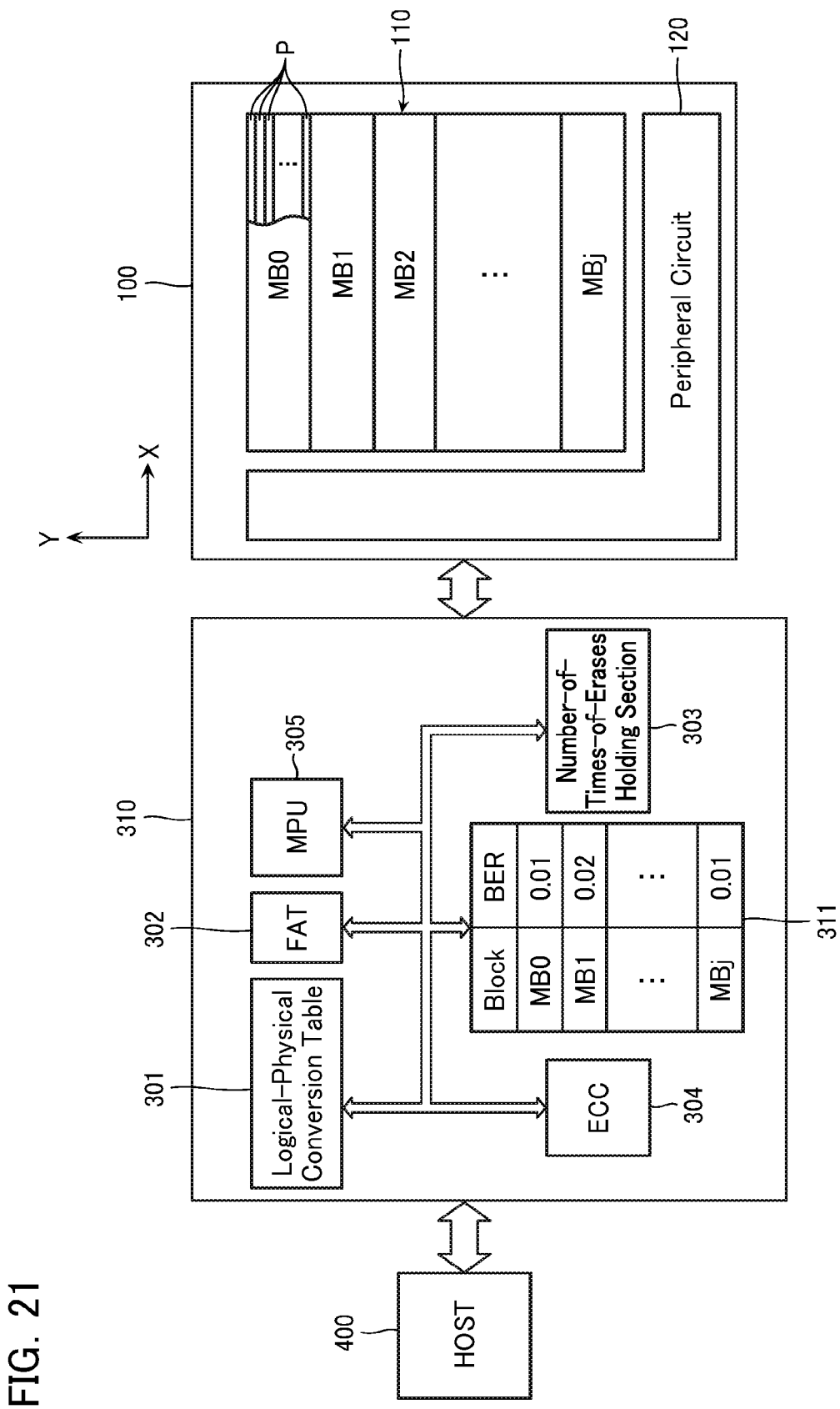
FIG. 21 is a functional block diagram showing a configuration of a semiconductor memory device according to a second embodiment.

As shown in FIG. 21, a controller chip 310 according to the present embodiment includes a bit-error-rate holding section 311 (memory) in addition to the configuration in the controller chip 300 (FIG. 14) according to the first embodiment. The bit-error-rate holding section 311 holds the physical address corresponding to the memory blocks MB0-MBj and the bit error rate corresponding to the memory blocks MB0-MBj in an associated manner. Note that, for example, the held bit error rate may be an average value of the bit error rate calculated for the pages P in the memory block MBi, or, may be a maximum value.

In the read sequence, the MPU 305 transmits data received from the memory chip 100 to the ECC circuit 304, and, acquires the bit error rate of this data. That is, in the present embodiment, the ECC circuit 304 functions as a bit-error-rate calculating section that calculates the bit error rate. Next, the acquired bit error rate is held, associated with an appropriate physical address, in the bit-error-rate holding section 311.

Figure 22:
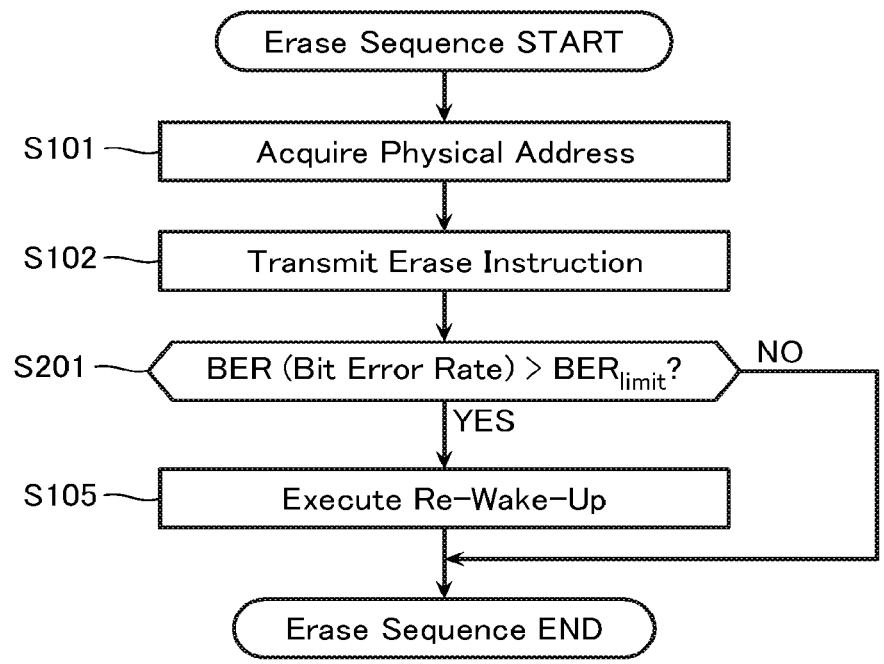
FIG. 22 is a flowchart for explaining about an erase sequence.

In the erase sequence, as shown in FIG. 22, the MPU 305 executes the erase process (step S102), and, then refers to the bit-error-rate holding section 311 and determines whether the bit error rate of the memory block MBi on which the erase process is executed is larger than a predetermined rate $BER_{limit}$, or not (step S201). If the rate is larger, the corresponding physical address and a predetermined instruction are transmitted to the memory chip 100, whereby the re-wake-up process is executed (step S105). Note that it is also possible to provide a means for holding a frag notifying that the re-wake-up process is necessary in a part of the memory chip 100, the controller chip 300 or the like. In this case, it is possible to send an instruction of the re-wake-up process to the controller chip 300 by means of software from an operation system or an application in an appropriate timing, for example.

Third Embodiment

Next, a semiconductor memory device according to a third embodiment will be described with reference to FIGS. 23 and 24. In the present embodiment, a FeRAM in which a memory cell includes a field effect transistor and a ferroelectric capacitor, will be described. Note that although detailed operation of the control circuit and so on will be omitted in the description below, the process and so on described in the first embodiment may be applied to the present embodiment.

Figure 23:
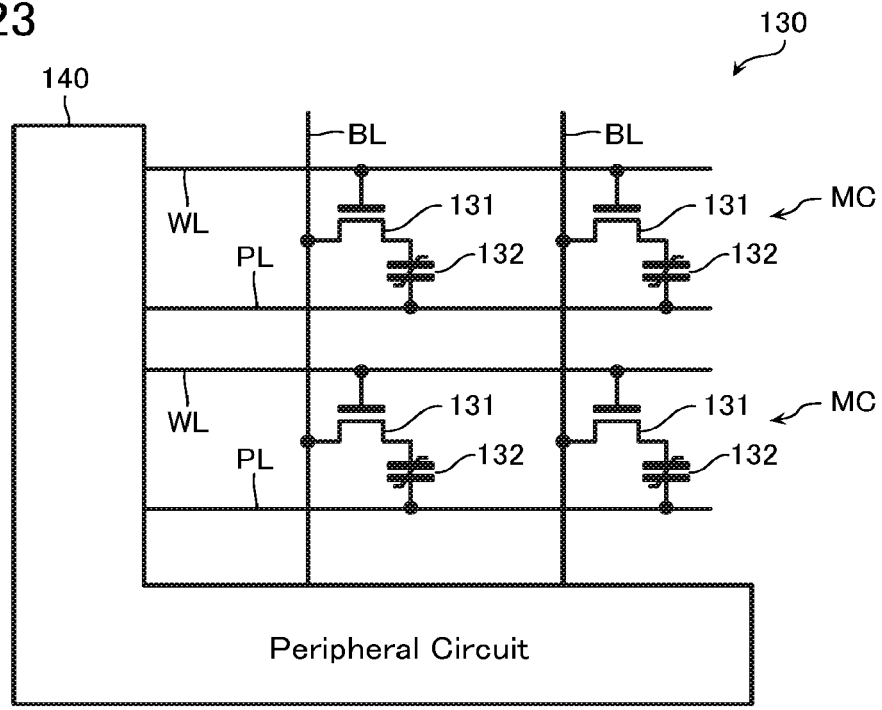
FIG. 23 is an equivalent circuit diagram showing a configuration of part of a semiconductor memory device according to a third embodiment.

As shown in FIG. 23, the memory chip according to the present embodiment includes: a memory cell array 130; and a peripheral circuit 140 provided in a periphery of the memory cell array 130.

The memory cell array 130 includes: a plurality of word lines WL and plate lines PL; a plurality of bit lines BL intersecting these word lines WL and plate lines PL; and a plurality of memory cells MC connected to these wirings. Note that the plurality of memory cells MC connected to one word line WL configure a page P.

The memory cell MC includes a field effect transistor (FET) 131 and a ferroelectric capacitor 132. The field effect transistor 131 includes a drain terminal connected to the bit line BL, source terminal connected to one end of the ferroelectric capacitor 132, and, gate terminal connected to the word line WL. The other end of the ferroelectric capacitor 132 is connected to the plate line PL.

Figure 24:
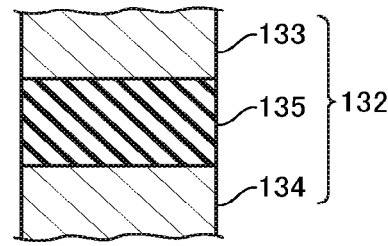
FIG. 24 is a schematic cross-sectional view showing a configuration of a memory cell MC.

As shown in FIG. 24, the ferroelectric capacitor 132 includes: a first electrode 133; a second electrode 134; and a ferroelectric film 135 provided between the first electrode 133 and second electrode 134. Note that the ferroelectric film 135 is configured from the likes of a material similar to that of the ferroelectric film 205 described with reference to FIG. 4.

The peripheral circuit 140 (FIG. 23) generates a voltage based on an instruction received from outside and applies the voltage to the memory cell array 130 to execute the likes of the write process, read process, erase process, and, re-wake-up process of data on a designated page P, and so on.

In the write process, for example, the page P corresponding to a received physical address is selected, and, the ferroelectric capacitors 132 in this page P are connected to the bit lines BL (FIG. 24). For example, an ON voltage is applied to the selected word line WL, and, an OFF voltage is applied to the unselected word lines WL. Next, write voltages are applied to the bit lines BL based on data to be written to the respective ferroelectric capacitors 132, and, the ground voltage is applied to the plate line PL. As a result, a voltage is applied to the ferroelectric films 135 of the ferroelectric capacitors 132 and data is written.

In the read process, for example, the page P corresponding to the received physical address is selected, and, the ferroelectric capacitors 132 in this page P are connected to the bit lines BL, similarly to in the above-described write process. Next, for example, a predetermined read voltage is applied to the plate line PL, and, the ground voltage is applied to the bit lines BL. Next, the current or voltage of the bit lines BL is detected, whereby data stored by the memory cells MC is distinguished.

In the erase process, for example, all of the pages P as a target of the erase process are selected, and, the ferroelectric capacitors 132 in these pages P are connected to the bit lines BL. Next, for example, a predetermined erase voltage is applied to the plate lines PL, and, the ground voltage is applied to the bit lines BL.

In the re-wake-up process, for example, all of the pages P as a target are selected, and, the ferroelectric capacitors 132 in these pages P are connected to the bit lines BL, similarly to in the erase process. Next, for example, voltages of at least one of plate lines PL and bit lines BL are controlled, whereby the first voltage and the second voltage described above are applied to the ferroelectric films 135.

As is described above, it is possible to execute the re-wake-up process even in the FeRAM whose memory cell MC includes the ferroelectric capacitor 132. Note that although the configuration according to the first embodiment is a non-destructive read memory, the configuration according to the present embodiment is a destructive read. In case that a number of times of the erase process is monitored in such a configuration, a number of times of the read process as an erase process may also be monitored in addition to the ordinary erase process.

Fourth Embodiment

Next, a semiconductor memory device according to a fourth embodiment will be described with reference to FIG. 25. In the present embodiment, a cross point type memory cell array including an FTJ as a memory cell will be described. Note that although detailed operation of the control circuit and so on will be omitted in the description below, the process and so on described in the first embodiment may be applied to the present embodiment.

Figure 25:
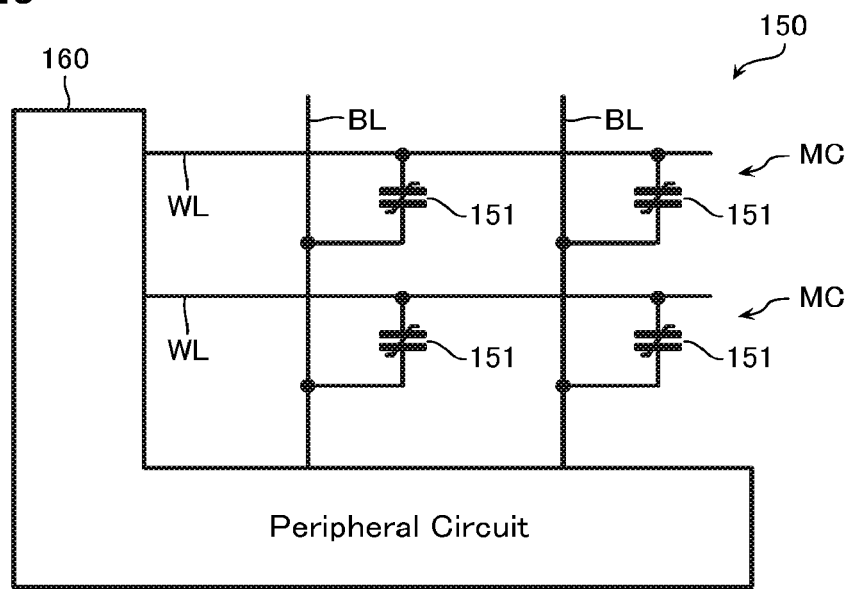
FIG. 25 is an equivalent circuit diagram showing a configuration of part of a semiconductor memory device according to a fourth embodiment.

As shown in FIG. 25, the memory chip according to the present embodiment includes: a memory cell array 150; and a peripheral circuit 160 provided in a periphery of the memory cell array 150.

The memory cell array 150 includes: a plurality of word lines WL; a plurality of bit lines BL intersecting these plurality of word lines WL; and a plurality of memory cells MC connected to these wirings. Note that the plurality of memory cells MC connected to one word line WL configure a page P.

The memory cell MC includes an FTJ 151. The FTJ 151 has a configuration substantially the same as that of the ferroelectric capacitor 132 described with reference to FIG. 24. However, in the FTJ 151, the ferroelectric film 135 is configured as a tunnel insulating film, and, has a film thickness of a degree that a tunnel current flows. Note that the memory cell MC may include a rectifier element such as a diode, in addition to the FTJ.

The peripheral circuit 160 (FIG. 25) generates a voltage based on an instruction received from outside and applies the voltage to the memory cell array 150 to execute the likes of the write process, read process, erase process, and, re-wake-up process of data on a designated page P, and, so on.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a memory cell including a ferroelectric film, and
    a control circuit controlling the memory cell,
    the control circuit
    determining whether a number of times of executions of a write process or an erase process on the memory cell is a multiple of a predetermined integer, and
    if the number of times of executions is a multiple of the predetermined integer, executing, a voltage application process in which a first voltage of a first polarity and a second voltage of a second polarity opposite to the first polarity are applied to the ferroelectric film.

2. The semiconductor memory device according to claim 1,
    the control circuit comprising a memory holding the number of times of executions,
    the control circuit
    updating the number of times of executions in the memory in response to an execution of the write process or the erase process, and
    referring to the memory at a time of determination of the number of times of executions.

3. The semiconductor memory device according to claim 1,
    the ferroelectric film including hafnium (Hf) and oxygen (O) as main components, and, including at least one of silicon (Si), magnesium (Mg), aluminum (Al), barium (Ba), zirconium (Zr), gadolinium (Gd), lanthanum (La), samarium (Sm), nitrogen (N) and yttrium (Y) as additive.

4. A semiconductor memory device, comprising:
    a memory cell including a ferroelectric film; and
    a control circuit controlling the memory cell,
    the control circuit
    applying a voltage of a first polarity to the ferroelectric film in a write process,
    applying a voltage of a second polarity opposite to the first polarity to the ferroelectric film in an erase process,
    determining whether a number of times of executions of the write process or the erase process on the memory cell has reached a predetermined number of times, and
    if the number of times of executions has reached the predetermined number of times,
    executing a voltage application process in which a first voltage of the first polarity and a second voltage of the second polarity are applied to the ferroelectric film,
    a magnitude of the first voltage being the same as or larger than a magnitude of a maximum voltage applied to the ferroelectric film in the write process, and
    a magnitude of the second voltage being the same as or larger than a magnitude of a maximum voltage applied to the ferroelectric film in the erase process.

5. The semiconductor memory device according to claim 4,
    the control circuit comprising a memory holding the number of times of executions,
    the control circuit
    updating the number of times of executions in the memory in response to an execution of the write process or the erase process, and
    referring to the memory at a time of determination of the number of times of executions.

6. The semiconductor memory device according to claim 4, the ferroelectric film including hafnium (Hf) and oxygen (O) as main components, and, including at least one of silicon (Si), magnesium (Mg), aluminum (Al), barium (Ba), zirconium (Zr), gadolinium (Gd), lanthanum (La), samarium (Sm), nitrogen (N) and yttrium (Y) as additive.

7. A semiconductor memory device, comprising:
a memory cell including a ferroelectric film, and
a control circuit controlling the memory cell, the control circuit
being capable of executing a write process, an erase process, a voltage application process, and an erase sequence in which data is erased from the memory cell, the erase sequence including at least one of the erase process or the voltage application process,
in the voltage application process, applying a first voltage of a first polarity and a second voltage of a second polarity opposite to the first polarity to the ferroelectric film,
determining whether a number of times of executions of the write process or the erase process on the memory cell has reached a predetermined number of times, and
if the number of times of executions has reached the predetermined number of times, in the erase sequence, executing the voltage application process in addition to or instead of the erase process.

8. The semiconductor memory device according to claim 7,
the control circuit comprising a memory holding the number of times of executions,
the control circuit
updating the number of times of executions in the memory in response to an execution of the write process or the erase process, and
referring to the memory at a time of determination of the number of times of executions.

9. The semiconductor memory device according to claim 7,
the ferroelectric film including hafnium (Hf) and oxygen (O) as main components, and, including at least one of silicon (Si), magnesium (Mg), aluminum (Al), barium (Ba), zirconium (Zr), gadolinium (Gd), lanthanum (La), samarium (Sm), nitrogen (N) and yttrium (Y) as additive.

10. A semiconductor memory device, comprising:
a memory cell including a ferroelectric film; and
a control circuit controlling the memory cell, the control circuit
determining whether a number of times of executions of a write process or an erase process on the memory cell has reached a predetermined number of times, and
if the number of times of executions has reached the predetermined number of times, executing a voltage application process in which a first voltage of a first polarity and a second voltage of a second polarity opposite to the first polarity are applied to the ferroelectric film after executing the erase process and before executing the write process.

11. The semiconductor memory device according to claim 10,
the control circuit comprising a memory holding the number of times of executions,
the control circuit
updating the number of times of executions in the memory in response to an execution of the write process or the erase process, and
referring to the memory at a time of determination of the number of times of executions.

12. The semiconductor memory device according to claim 10,
the ferroelectric film including hafnium (Hf) and oxygen (O) as main components, and, including at least one of silicon (Si), magnesium (Mg), aluminum (Al), barium (Ba), zirconium (Zr), gadolinium (Gd), lanthanum (La), samarium (Sm), nitrogen (N) and yttrium (Y) as additive.

13. A semiconductor memory device, comprising:
a memory cell including a ferroelectric film; and
a control circuit controlling the memory cell,
the control circuit
determining whether a number of times of executions of a write process or an erase process on the memory cell has reached a predetermined number of times, and
if the number of times of executions has reached the predetermined number of times, executing a voltage application process in which a first voltage of a first polarity and a second voltage of a second polarity opposite to the first polarity are alternately applied to the ferroelectric film a plurality of times.

14. The semiconductor memory device according to claim 13,
the control circuit comprising a memory holding the number of times of executions,
the control circuit
updating the number of times of executions in the memory in response to an execution of the write process or the erase process, and
referring to the memory at a time of determination of the number of times of executions.

15. The semiconductor memory device according to claim 13,
the ferroelectric film including hafnium (Hf) and oxygen (O) as main components, and, including at least one of silicon (Si), magnesium (Mg), aluminum (Al), barium (Ba), zirconium (Zr), gadolinium (Gd), lanthanum (La), samarium (Sm), nitrogen (N) and yttrium (Y) as additive.

* * * * *